(12) United States Patent
Seo

(10) Patent No.: US 10,108,030 B2
(45) Date of Patent: Oct. 23, 2018

(54) DISPLAY DEVICE

(71) Applicant: SAMSUNG DISPLAY CO., LTD., Yongin-si, Gyeonggi-Do (KR)

(72) Inventor: Hae-Kwan Seo, Hwaseong-si (KR)

(73) Assignee: SAMSUNG DISPLAY CO., LTD., Yongin-si, Gyeonggi-do (KR)

( * ) Notice: Subject to any disclaimer, the term of this patent is extended or adjusted under 35 U.S.C. 154(b) by 112 days.

(21) Appl. No.: 15/047,658

(22) Filed: Feb. 19, 2016

(65) Prior Publication Data

US 2016/0316582 A1 Oct. 27, 2016

(30) Foreign Application Priority Data

Apr. 24, 2015 (KR) .................. 10-2015-0058114

(51) Int. Cl.
| | |
|---|---|
| *H05K 7/02* | (2006.01) |
| *G02F 1/13* | (2006.01) |
| *H05K 5/00* | (2006.01) |
| *G06F 1/16* | (2006.01) |

(52) U.S. Cl.
CPC .............. *G02F 1/13* (2013.01); *G06F 1/1647* (2013.01); *H05K 5/0017* (2013.01); *H05K 7/02* (2013.01)

(58) Field of Classification Search
CPC ... G06F 1/1647; G06F 1/1652; H05K 5/0017; H05K 2201/10128; H05K 7/02; G02F 1/13
USPC .................................................... 361/679.01
See application file for complete search history.

(56) References Cited

U.S. PATENT DOCUMENTS

| | | | | |
|---|---|---|---|---|
| 5,424,153 | A * | 6/1995 | Asai .................... | G03F 1/29 430/311 |
| 8,736,162 | B2 * | 5/2014 | Jin ..................... | G09F 9/33 313/483 |
| 2006/0209058 | A1 | 9/2006 | Nakamura et al. | |
| 2008/0043009 | A1 * | 2/2008 | Kim ................. | G09G 3/3622 345/211 |
| 2014/0049449 | A1 * | 2/2014 | Park .................. | G09G 5/00 345/1.3 |
| 2014/0098471 | A1 * | 4/2014 | Nam ................. | H05K 7/00 361/679.01 |
| 2015/0062465 | A1 * | 3/2015 | Her ................... | G06F 3/045 349/12 |
| 2016/0181346 | A1 * | 6/2016 | Kwon .............. | H01L 27/3276 257/40 |

(Continued)

FOREIGN PATENT DOCUMENTS

| | | |
|---|---|---|
| JP | 2013-225620 A | 10/2013 |
| KR | 10-1296662 B1 | 8/2013 |

(Continued)

*Primary Examiner* — Dimary Lopez Cruz
*Assistant Examiner* — Ingrid Wright
(74) *Attorney, Agent, or Firm* — Lee & Morse, P.C.

(57) ABSTRACT

A display device includes a window layer, a first display panel, and a second display panel. The window layer has at least one bent area adjacent a non-bent area. The first display panel is on a first side of the window layer at a position corresponding to the at least one bent area. The second display panel is on the first side of the window layer at a position corresponding to the non-bent area. The first display panel is in a first display area to display an image, and a first non-display area is adjacent the non-bent area and between the first display area and the non-bent area.

9 Claims, 16 Drawing Sheets

(56) References Cited

U.S. PATENT DOCUMENTS

2017/0084248 A1* 3/2017 Shi .................. G09G 5/006

FOREIGN PATENT DOCUMENTS

| KR | 10-2014-0093360 A | 7/2014 |
| KR | 10-2014-0103547 A | 8/2014 |
| WO | WO 2004/090847 A1 | 10/2004 |

* cited by examiner

DISPLAY DEVICE

CROSS-REFERENCE TO RELATED APPLICATION

Korean Patent Application No. 10-2015-0058114, filed on Apr. 24, 2015, and entitled, "Display Device," is incorporated by reference herein in its entirety.

BACKGROUND

1. Field

One or more embodiments described herein relate to a display device.

2. Description of the Related Art

A variety of display devices have been developed. Examples include a liquid crystal display, a plasma display panel, an organic light emitting diode (OLED) device, a field effect display, and an electrophoretic display device. OLED devices are thinner, lighter in weight, consume less power, have higher luminance, and faster response speeds than many other devices. Also, an OLED device has self-luminance characteristics and thus does not require a separate light source, e.g., a backlight.

Structurally, an OLED device includes an organic emission layer between two electrodes. Electrons injected from one electrode and holes injected from the other electrode are coupled in the organic emission layer to generate excitons. When the excitons change state, light is emitted.

Recently, OLED and other display devices have been developed to have curved lateral sides. Light emitted at the curved lateral sides is refracted or scattered, which adversely affects the quality of a displayed image.

SUMMARY

In accordance with one or more embodiments, a display device includes a window layer including at least one bent area adjacent a non-bent area; a first display panel on a first side of the window layer and at a position corresponding to the at least one bent area; and a second display panel on the first side of the window layer and at a position corresponding to the non-bent area, wherein the first display panel is in a first display area to display an image, and a first non-display area is adjacent the non-bent area and between the first display area and the non-bent area.

The display device may include a light blocking layer at a position corresponding to the first non-display area of the first display panel on a lower portion of the window layer. The light blocking layer may include a light blocking material.

The display device may include a first driver to drive the first and second display panels in the first non-display area on a lower portion of the window layer, and the first driver may include: a first gate driver connected to the first and second display panels; and a first emission control driver connected to the first and second display panels.

The display device may include first and second drivers to respectively drive the first and second display panels, the first and second drivers in the first non-display area on a lower portion of the window layer, wherein: the first driver includes a first gate driver and a first emission control driver connected to the first display panel, and the second driver includes a second gate driver and a second emission control driver connected to the second display panel.

The second display panel may include a second display area to display an image; and a second non-display area to not display an image. The display device may include a driver to drive the first or second display panel, wherein the driver is in at least one of the first or second non-display areas on a lower portion of the window layer. The first and second drivers may be at positions that respectively correspond to the first and second non-display areas, the first driver may include a first gate driver and a first emission control driver connected to the first display panel, and the second driver may include a second gate driver and a second emission control driver connected to the second display panel.

The display device may include first and second drivers are at positions that respectively correspond to the first and second non-display areas, the first driver may include a first gate driver connected to the first display panel, and the second driver may include a second gate driver connected to the second display panel and a second emission control driver connected to the first and second display panels. The first and second drivers may be at positions that respectively correspond to the first and second non-display areas, the first driver may include a first gate driver connected to the first and second display panels, and the second driver may include a second emission control driver connected to the first and second display panel.

The display device may include a second driver is at a position corresponding to the second non-display area, and the second driver may include a second gate driver connected to the first and second display panels and a second emission control driver connected to the first and second display panel. The display device may include a first data wire connected to the first display panel; a second data wire connected to the second display panel; and a control signal line connected to the first driver, wherein the control signal line is between the first and second data wires.

In accordance with one or more other embodiments, a display device includes a first display area; a second display area; a third area between the first and second display areas, wherein the first display area is at a central location of the display device, the second display area is on a side of the display device adjacent the first display area, and the third area is a non-display area, and wherein the first display area is oriented at a first angle and the second display area is oriented at a second angle different from the first angle. The second angle may be greater than the first angle. The second display area may be curved or bent.

The display device may include a window layer overlapping the first and second display areas and the third area, wherein the window layer has a first section oriented at the first angle and a second section oriented at the second angle. The window layer may continuously extend from the first display area to the second display area through the third area. The display device may include an opaque layer overlapping the third area. The display device may include a first display panel for the second display area; and a first driver to drive the first display panel, wherein the first driver overlaps the third area.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
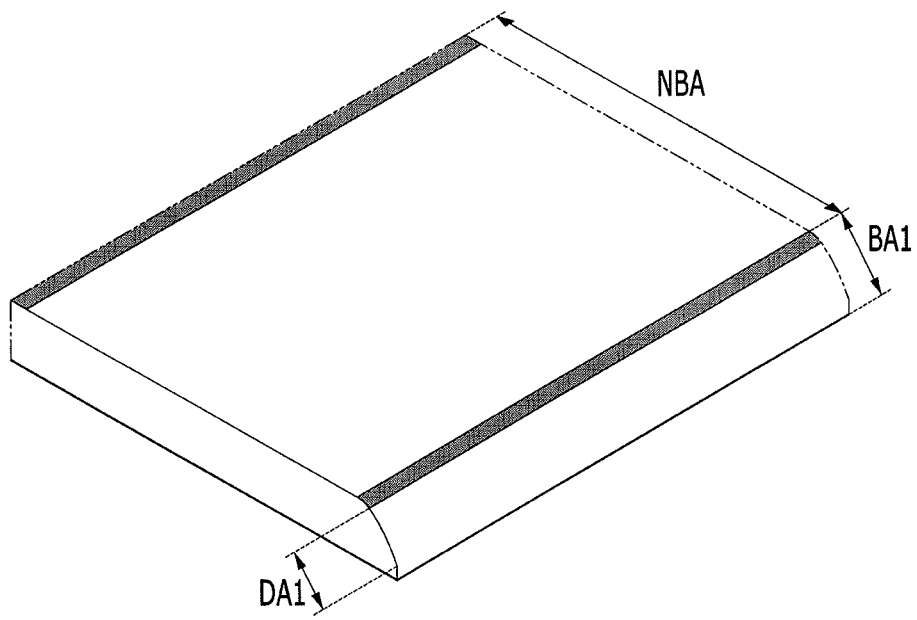
FIG. 1 illustrates an embodiment of a display device.

Example embodiments are described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art. The embodiments may be combined to form additional embodiments.

It will be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

When an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless there is different disclosure.

Figure 2:
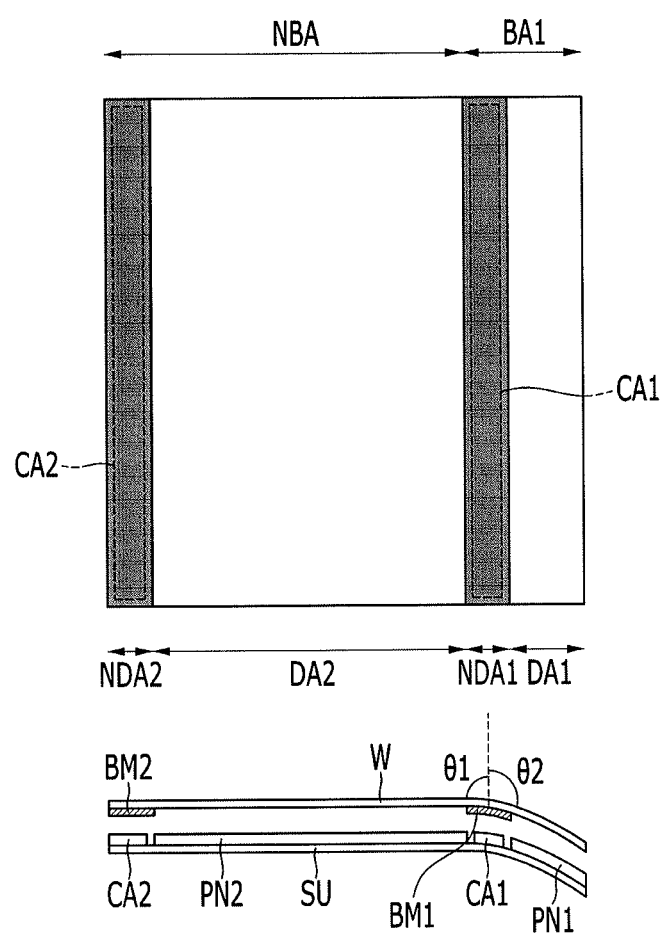
FIG. 2 illustrates other views of the display device.

FIGS. 1 and 2 illustrate an embodiment of a display device which includes a window layer (W) and first and second display panels PN1 and PN2. The window layer (W) may be located at an outermost region in the display device for allowing images generated by the first and second display panels PN1 and PN2 to be viewed by a user.

The window layer W may be formed with a flexible material that bends when the first and second display panels PN1 and PN2 bend. In another embodiment, the window layer W may not include a flexible material (e.g., may be formed of a rigid material). In this case, the window layer W may be processed and manufactured to correspond to the shapes of bent or curved first and second display panels PN1 and PN2.

To electrically insulate the inside of the display device, an insulating material may be included. The insulating layer may be formed of a transparent material that transmits light generated by the first and second display panels PN1 and PN2. The window layer W may be made, for example, of glass, plastic, or another material.

As shown in FIGS. 1 and 2, the window layer W may include a non-bent area (NBA) and a first bent area BA1. The non-bent area NBA corresponds to a virtual partition indicating a flat area. The first bent area BA1 is an area excluding the non-bent area (NBA), and corresponds to a bent, angled, inclined, or curved area of the display device. The first bent area BA1 may be provided on an edge of the window layer W so the display device has a bent edge. Thus, the non-bent area NBA may be oriented at a first angle $\theta_1$ relative to a vertical axis (dotted line) and the first bent area BA1 may be oriented at a second angle $\theta_2$ relative to the vertical axis.

The first and second display panels PN1 and PN2 display images in the display device, and may be disposed on a lower side of the window layer W. Display panels of an organic light emitting device may be applied to the first and second display panels PN1 and PN2. In another embodiment, the display device may include a liquid crystal display, plasma display panel, field effect display, or electrophoretic display device.

In an OLED embodiment, the first and second display panels PN1 and PN2 may include one or more thin film transistors, pixel electrodes, organic emission layers, driving circuits, and a common electrode.

The first display panel PN1 is provided in the first bent area BA1 to display an image on the bent side of the display device. The second display panel PN2 is provided in the non-bent area (NBA) to display an image in a flat area of the display device. That is, the first display panel PN1 may display an image at the first bent area BA1, and the second display panel PN2 may display an image at the non-bent area (NBA). In one embodiment, a second bent area BA2 may be formed at another (e.g., opposing) side of the non-bent area NBA relative to the first bent area BA1. The second bent area BA2 may include a third display panel PN3 (e.g., refer to FIG. 13).

Referring to FIG. 2, the first display panel PN1 includes a first display area DA1 and a first non-display area NDA1. The first display area DA1 represents a virtual partition for displaying an actual image on the first display panel PN1. The first non-display area NDA1 excludes the first display area DA1 and represents a virtual partition for not displaying an image.

The first display area DA1 of the first display panel PN1 may include, for example, one or more thin film pixel transistors, pixel electrodes, organic emission layers, and a common electrode. A first driver CA1 for driving the above-noted configuration in the first display area DA1 may be in the first non-display area NDA1. In FIG. 2, reference numeral PN1 indicates a configuration for displaying an actual image from among the first display panel.

The second display panel PN2 may include a second display area DA2 and a second non-display area NDA2. The second display area DA2 represents a virtual partition for displaying an actual image on the second display panel PN2. The second non-display area NDA2 excludes the second display area DA2 and represents a virtual partition for not displaying an image.

In like manner, the second display area DA2 of the second display panel PN2 includes one or more thin film pixel transistors, pixel electrodes, organic emission layers, and a common electrode. A second driver CA2 for driving the above-noted configuration in the second display area DA2 may be in the second non-display area NDA2. In FIG. 2, reference numeral PN2 indicates a configuration for displaying an actual image from among the second display panel.

The first non-display area NDA1 of the first display panel may be disposed near the non-bent area NBA. As shown in FIGS. 1 and 2, the first non-display area NDA1 in the first bent area BA1 is disposed to touch an edge of the first non-bent area NBA. The first non-display area NDA1 for not displaying an image is between the second display panel PN2 and the first display panel PN1 for displaying an actual image. For example, an area for displaying an image does not exist in an area near the non-bent area NBA and starts being bent from the first bent area BA1.

Figure 15:
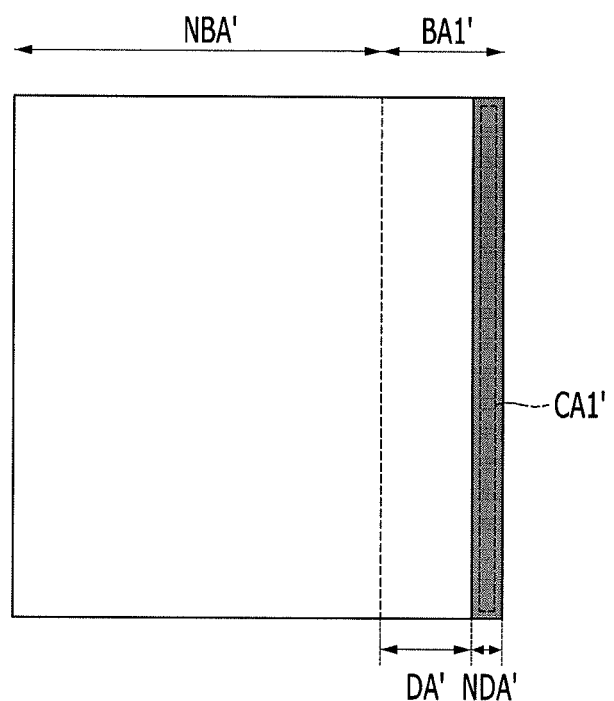
FIGS. 15 and 16 illustrate another type of display device.
Figure 16:
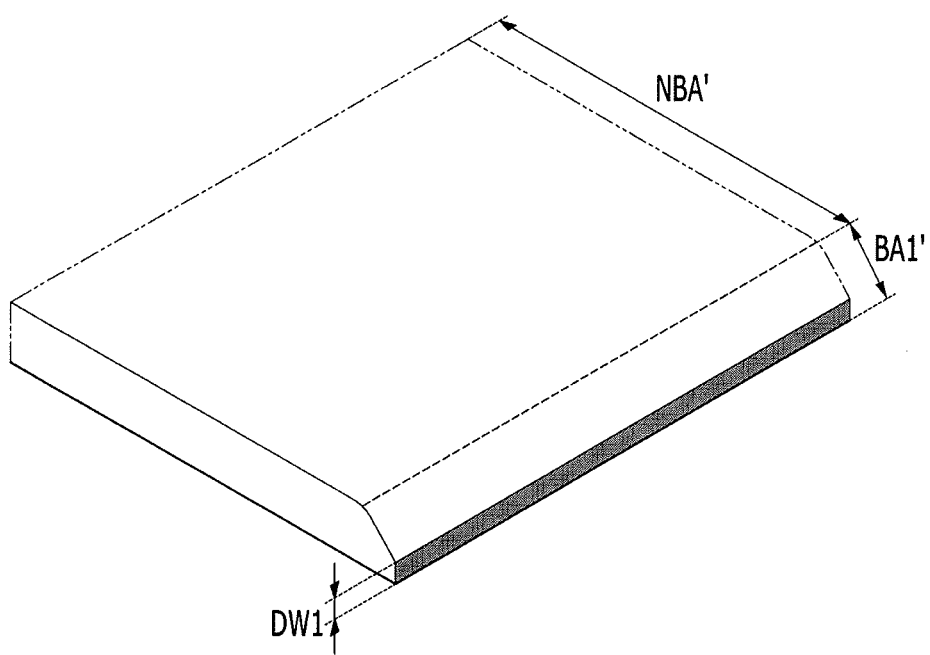

FIGS. 15 and 16 show another type of display device. The first display area (DA') is near non-bent area (NBA'). Thus, in contrast to the display device of FIGS. 1 and 2, an area for displaying an image exists in an area near the non-bent area NBA' and starts being bent from the first bent area BA1'. As shown in FIGS. 15 and 16, when an image is displayed in the area that starts being bent corresponding to the first non-display area NDA1 of FIG. 2, the image transmitted to the user is not clear because of refraction or scattering of light. When the image in the above-noted area is not clear, part of the non-bent area NBA' near the area may not be recognized as being clear.

However, in the display device of FIGS. 1 and 2, an area for displaying an image does not exist in the area near the non-bent area NBA and starts being bent from the first bent area BA1. As a result, a clear image may be transmitted to the user from the first bent area BA1. Also, a clear image in the non-bent area NBA may be transmitted to the user.

Also, in the display device of FIGS. 15 and 16, the first non-display area NDA' is on the edge of the display device. One or more drivers may be formed in the first non-display area NDA'. Thus, the first non-display area (NDA') may correspond to a dead space DW1 of the display device. However, the first non-display area NDA1 is between the first and second display panels PN1 and PN2, to reduce or eliminate dead space. Accordingly, the width of a bezel at the edge of the display device may be reduced or minimized.

As shown in FIGS. 1 and 2, a light blocking layer BM1 may be formed at a position corresponding to the first non-display area NDA1 on a lower portion of the window layer W. The light blocking layer BM1 prevents the first non-display area NDA1 on the lower portion from being seen externally exposed. For example, the first driver CA1 in the first non-display area NDA1 may not be exposed. The light blocking layer BM1 may be made of a light blocking material for intercepting transmission of light. The light blocking layer BM1 may be an opaque layer. For example, the light blocking layer may include, for example, a black matrix (BM) material.

Figure 3:
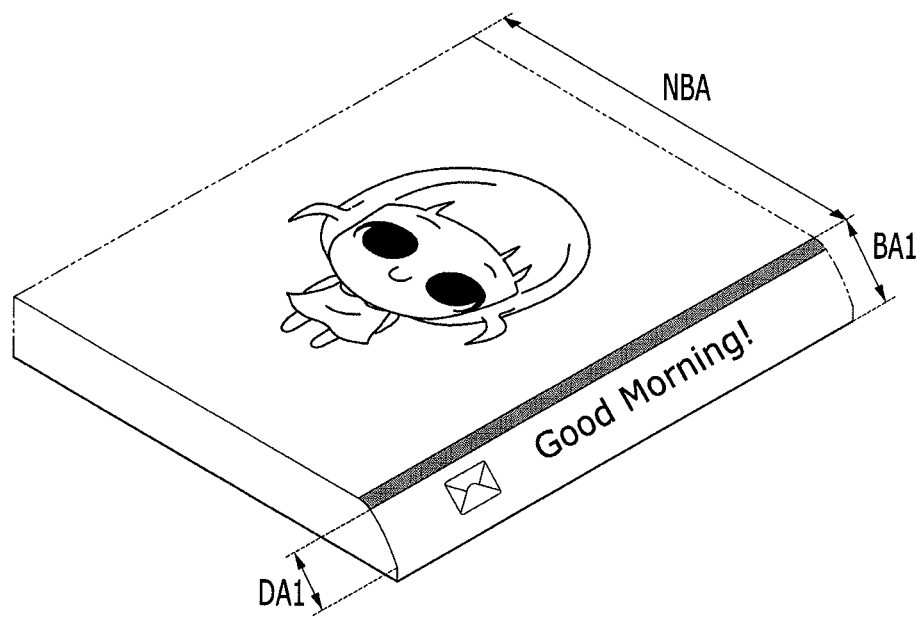
FIGS. 3-5 illustrate operational states of the display device.
Figure 4:
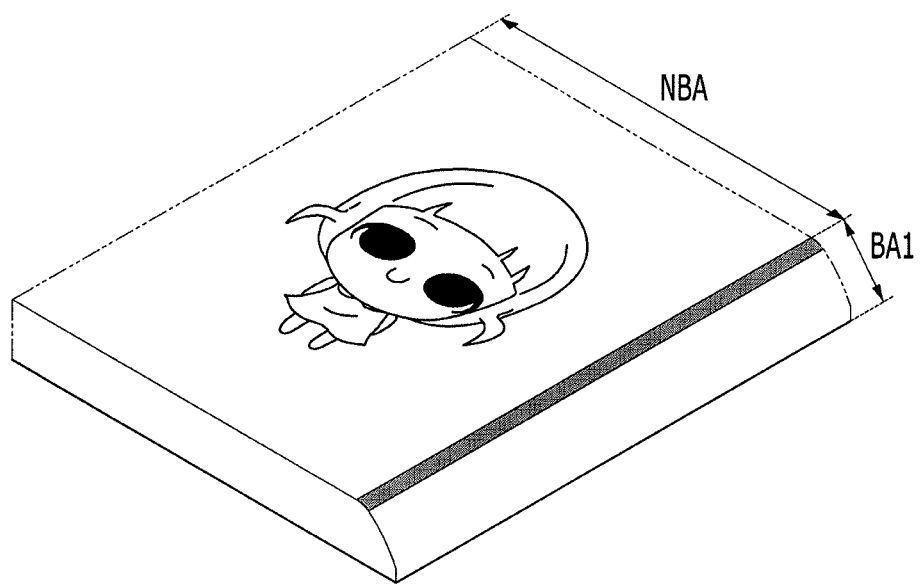
Figure 5:
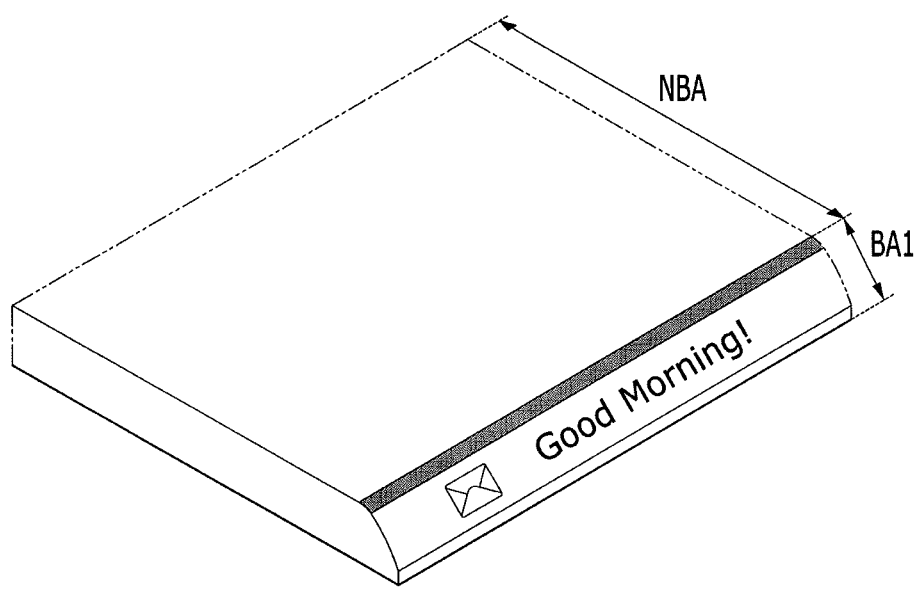

FIGS. 3-5 illustrate examples of operational states of the display device in FIGS. 1 and 2. In these examples, the first and second display panels PN1 and PN2 are separately disposed with reference to the first non-display area NDA1. The first and second display panels PN1 and PN2 are driven by first and second drivers CA1 and CA2 in the first and second non-display areas NDA1 and NDA2. Therefore, the first and second drivers CA1 and CA2 may respectively drive the first and second display panels PN1 and PN2, simultaneously or selectively.

For example, as shown in FIG. 3, the first and second display panels PN1 and PN2 are simultaneously driven by the first and second drivers CA1 and CA2. As shown in FIG. 4, the second display panel PN2 is driven by the second driver CA2. As shown in FIG. 5, the first display panel PN1 is driven by the first driver CA1.

The first and second display panels PN1 and PN2 may be driven independently to display different images, to selectively display images, and/or to reduce the number of display panels being driven. In this latter case, power consumption may be reduced.

Figure 6:
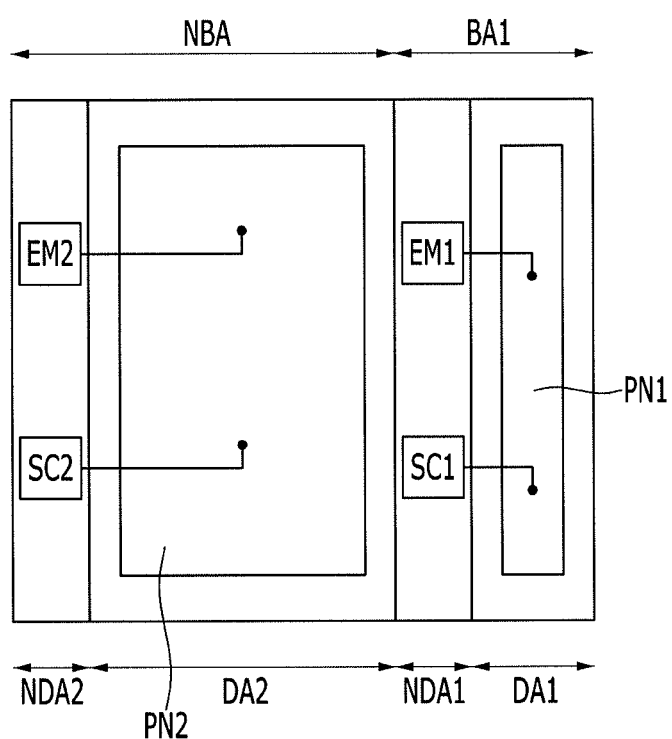
FIGS. 6-9 illustrate embodiments of drivers of the display device.

FIGS. 6-9 illustrate embodiments of the first and second driver CA1 or CA2 of the display device. Referring to FIG. 6, the first driver CA1 may be at a position corresponding to the first non-display area NDA1. The first driver CA1 is connected to the first display panel PN1 to drive the first display panel PN1.

The first driver CA1 includes a first gate driver SC1 and a first emission control driver EM1. The first gate driver SC1 and the first emission control driver EM1 are connected to the first display panel PN1.

The first emission control driver EM1 is connected to an emission control line of the first display panel PN1 to supply an emission control signal to the first display panel PN1. The emission control signal may control an emission time of pixels. The first gate driver SC1 is connected to a scan line of the first display panel PN1, to supply a scan signal to the first display panel PN1.

The second driver CA2 may be at a position corresponding to the second non-display area NDA2. The second driver CA2 is connected to the second display panel PN2, to drive the second display panel PN2. The second driver CA2 includes a second gate driver SC2 and a second emission control driver EM2. The second gate driver SC2 and the second emission control driver EM2 are connected to the second display panel PN2.

The second emission control driver EM2 may be connected to an emission control line of the second display panel PN2, to supply an emission control signal to the second display panel PN2. The emission control signal may control the emission time of pixels. The second gate driver SC2 may be connected to a scan line of the second display panel PN2, to supply a scan signal to the second display panel PN2.

Figure 7:
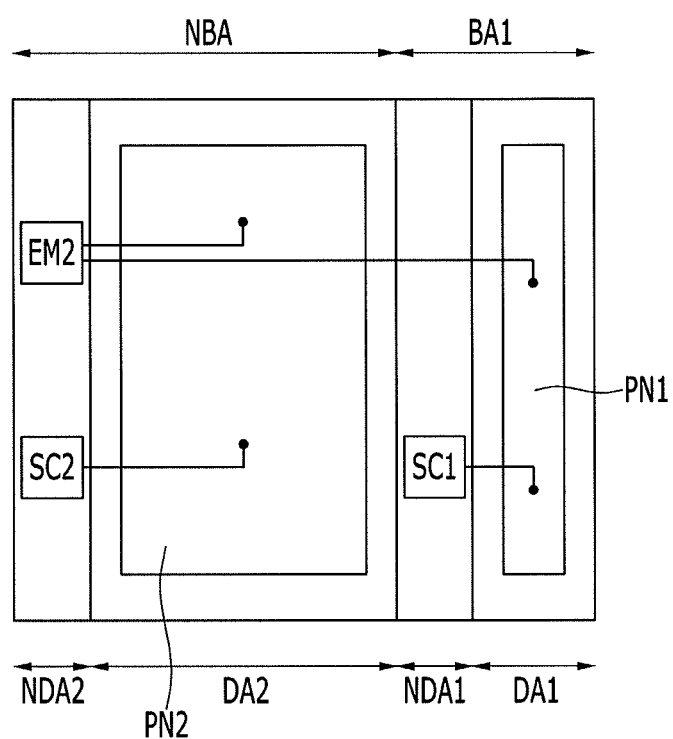

Referring to FIG. 7, the first driver CA1 may be at a position corresponding to the first non-display area NDA1. The first driver CA1 is connected to the first display panel PN1, to drive the first display panel PN1. The first driver CA1 includes a first gate driver SC1 connected to the first display panel PN1. The first gate driver SC1 may be connected to a scan line of the first display panel PN1, to supply a scan signal to the first display panel PN1.

The second driver CA2 may be at a position corresponding to the second non-display area NDA2. The second driver CA2 may include a second gate driver SC2 and a second emission control driver EM2. The second gate driver SC2 may be connected to a scan line of the second display panel PN2, to supply a scan signal to the second display panel PN2.

Unlike FIG. 6, the second emission control driver EM2 is connected to emission control lines of the first and second display panels PN1 and PN2, to supply emission control signals to the first and second display panels PN1 and PN2.

Figure 8:
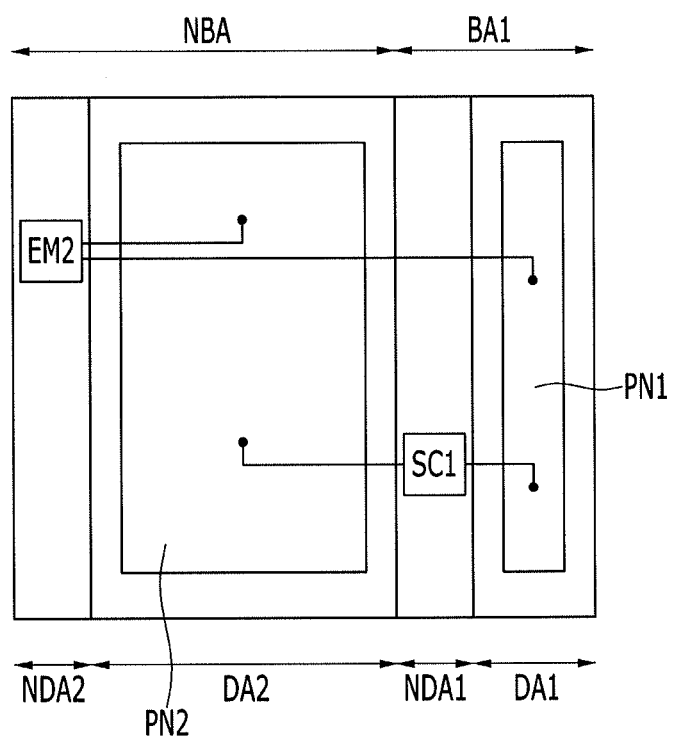

Referring to FIG. 8, the first driver CA1 may be at a position corresponding to the first non-display area NDA1. The first driver CA1 includes a first gate driver SC1 connected to the first and second display panels PN1 and PN2. For example, the first gate driver SC1 is connected to scan lines of the first and second display panels PN1 and PN2, to supply scan signals to the first and second display panels PN1 and PN2.

The second driver CA2 is at a position corresponding to the second non-display area NDA2. The second driver CA2 includes a second emission control driver EM2 connected to emission control lines of the first and second display panels PN1 and PN2, to supply emission control signals to the first and second display panels PN1 and PN2.

Figure 9:
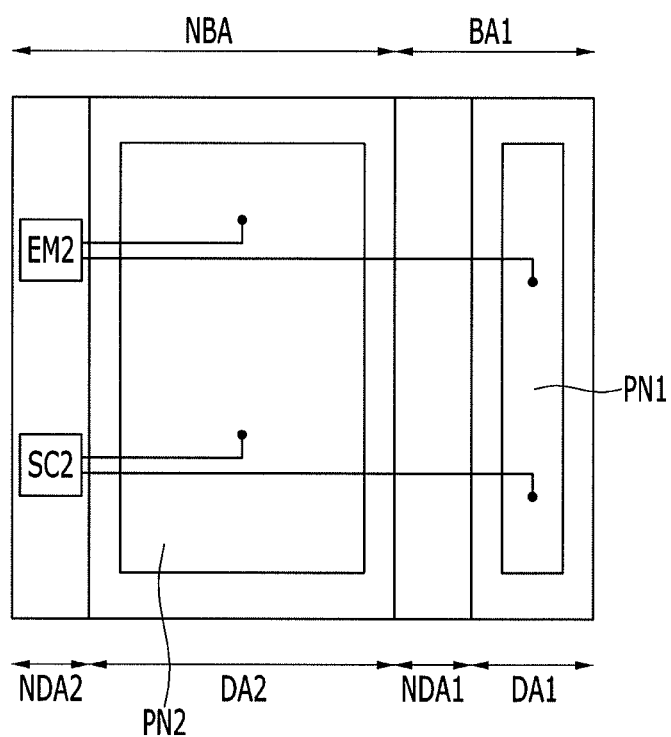

Referring to FIG. 9, the second driver CA2 may be at a position corresponding to the second non-display area NDA2. The second driver CA2 is connected to the first and second display panels PN1 and PN2, to drive the first and second display panels PN1 and PN2. Unlike FIG. 6, a driver is not in the first non-display area NDA1.

The second driver CA2 includes a second gate driver SC2 and a second emission control driver EM2. The second gate driver SC2 is connected to the first and second display panels PN1 and PN2. For example, second gate driver SC2 is connected to scan lines of the first and second display panels PN1 and PN2, to supply scan signals to the first and second display panels PN1 and PN2.

The second emission control driver EM2 is connected to emission control lines of the first and second display panels PN1 and PN2, to supply emission control signals to the first and second display panels PN1 and PN2.

Figure 14:
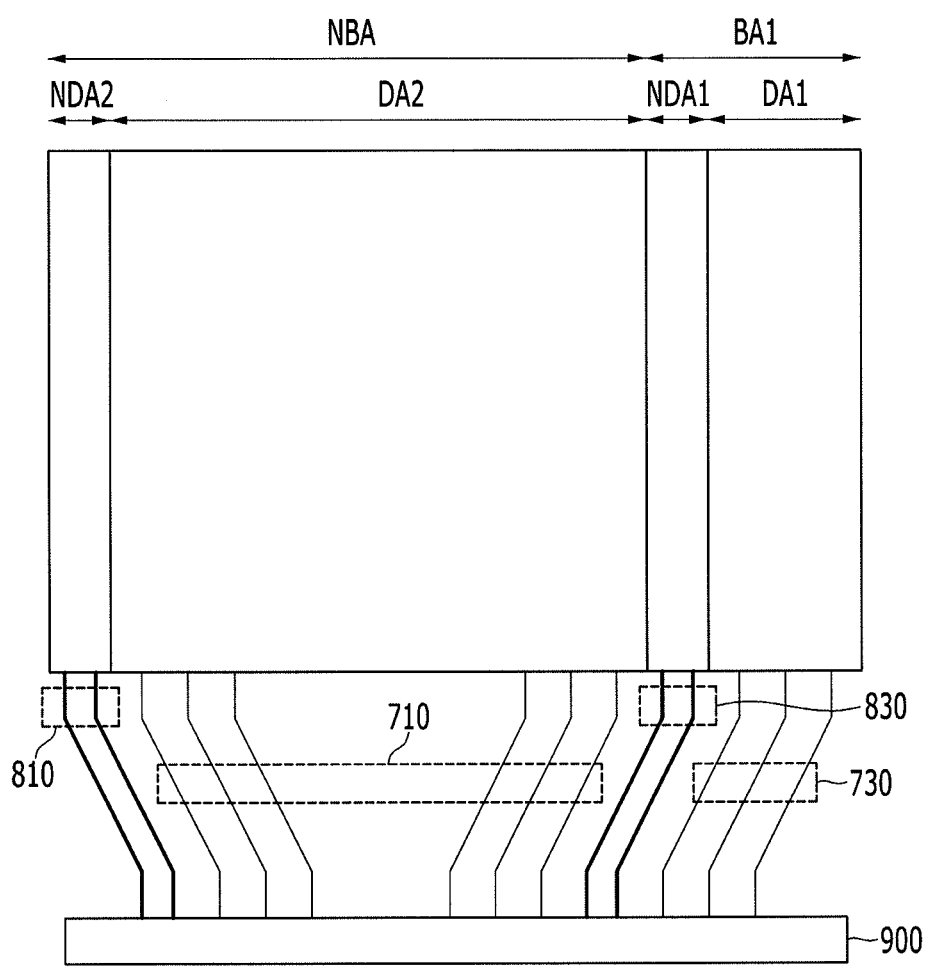
FIG. 14 illustrates layout embodiment of a wire of a display device.

Referring to FIG. 14, the display device includes a first data wire 730, a second data wire 710, and a control signal line 830. The first data wire 730 supplies a data signal to the first display panel PN1. A data driver 900 may be connected to the first data wire 730 to supply a data signal to the first display panel PN1 based on a control signal, for example, from an external device, e.g., a timing controller.

The second data wire 710 supplies a data signal to the second display panel PN2. The data driver 900 may be connected to the second data wire 710 to supply a data signal to the second display panel PN2 based on a control signal, for example, provided by an external device, e.g., a timing controller.

The control signal line 830 is connected to the first driver CA1 in the first non-display area NDA1 to supply a control signal, to allow the emission control signal or the scan signal to be supplied to the first display panel PN1. The control signal line 830 may be between the first and second data wires 730 and 710. For example, the first data wire 730, the control signal line 830, and the second data wire 710 may be in parallel on a substrate (SU).

Figure 10:
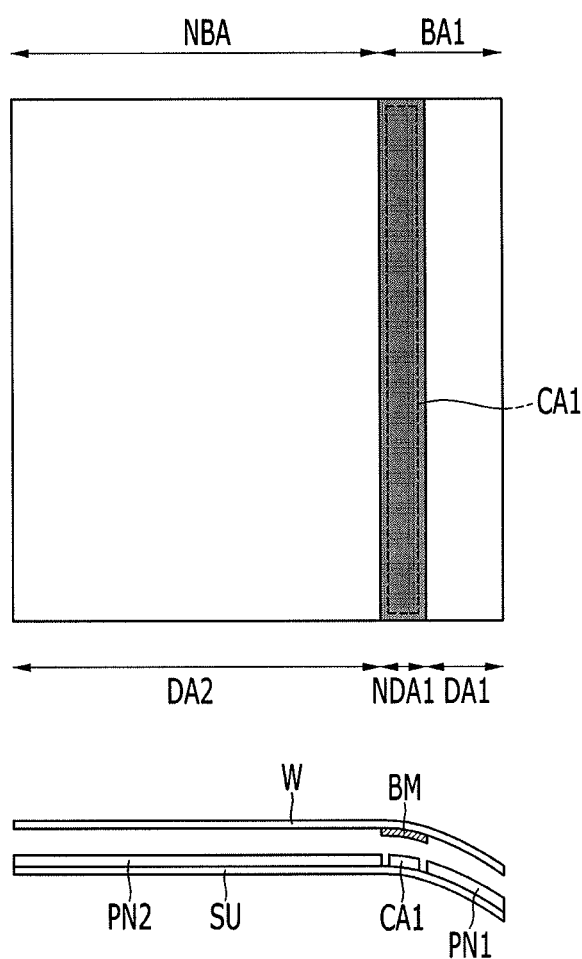
FIG. 10 illustrates another embodiment of a display device.
Figure 11:
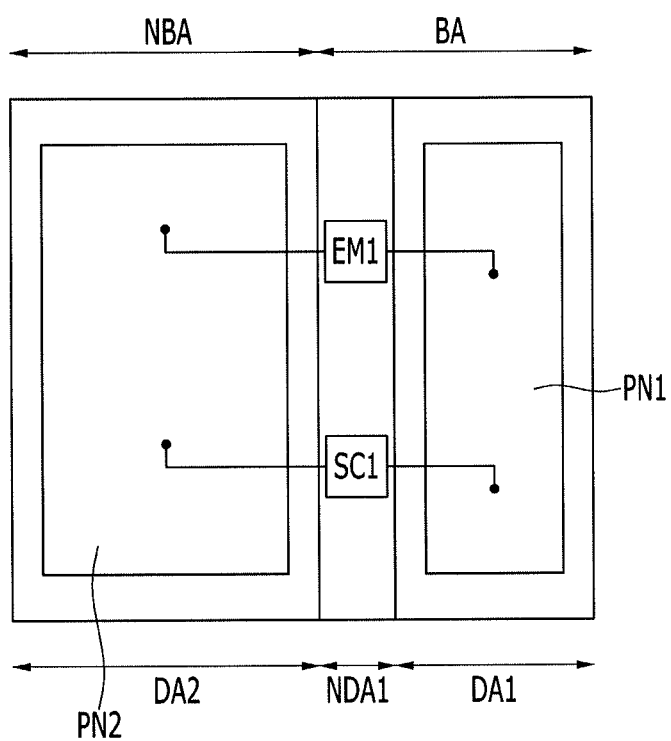
FIGS. 11 and 12 illustrate embodiments of drivers of the display device in FIG. 10.
Figure 12:
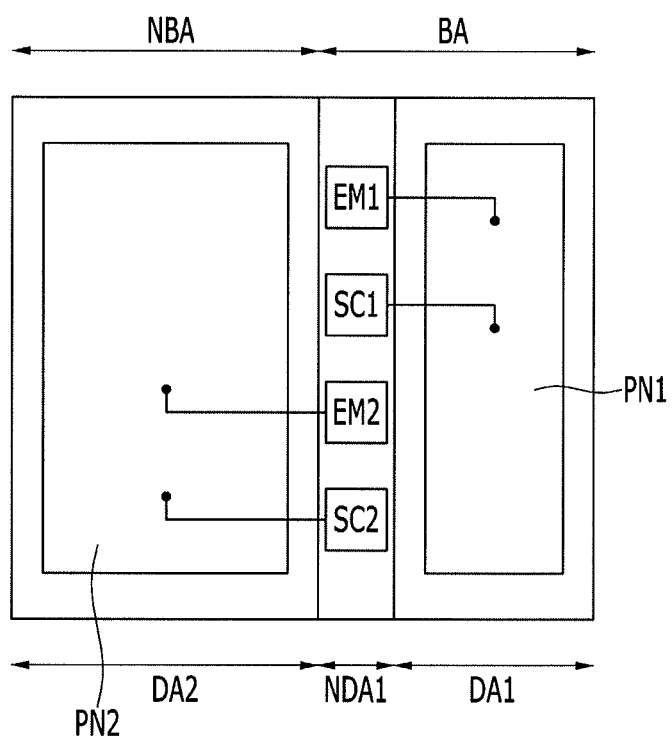

FIGS. 10-12 illustrate another embodiment of a display device. FIG. 10 shows plane and cross-sectional views of the display device, and FIGS. 11 and 12 illustrate first and second drivers according of the display device.

Referring to FIG. 10, unlike the display device of FIGS. 1 and 2, a second display panel PN2 in a non-bent area NBA does not have a second non-display area NDA2, e.g., the second display area DA2 may be on the second display panel PN2. The second driver CA2 for driving the second display panel PN2 is in the second non-display area NDA2 of the second display panel PN2. The driver for driving the second display panel PN2 may be in the first non-display area NDA1 of first bent area BA1. Thus, the width of the bezel near the second display panel PN2 may be reduced or minimized by removing the second non-display area of the second display panel PN2.

Referring to FIG. 11, the first driver CA1 is at the position corresponding to the first non-display area NDA1. The first driver CA1 is connected to the first and second display panels PN1 and PN2, to drive the first and second display panels PN1 and PN2.

The first driver CA1 includes a first gate driver SC1 and a first emission control driver EM1. The first gate driver SC1 is connected to the first and second display panels PN1 and PN2. For example, the first gate driver SC1 may be connected to scan lines of the first and second display panels PN1 and PN2, to supply scan signals to the first and second display panels PN1 and PN2. The first emission control driver EM1 may be connected to emission control lines of the first and second display panels PN1 and PN2, to supply emission control signals to the first and second display panels PN1 and PN2.

Referring to FIG. 12, the first and second drivers CA1 and CA2 are at a position corresponding to the first non-display area NDA1. For example, the first and second drivers CA1 and CA2 are in the first non-display area NDA1.

The first driver CA1 includes a first gate driver SC1 and a first emission control driver EM1. The first gate driver SC1 and the first emission control driver EM1 are connected to the first display panel PN1.

The first emission control driver EM1 is connected to an emission control line of the first display panel PN1, to supply an emission control signal to the first display panel PN1. The emission control signal controls the emission time of pixels. The first gate driver SC1 may be connected to a scan line of the first display panel PN1, to supply a scan signal to the first display panel PN1.

The second driver CA2 is connected to the second display panel PN2, to drive the second display panel PN2. The second driver CA2 includes a second gate driver SC2 and a second emission control driver EM2. The second gate driver SC2 and the second emission control driver EM2 are connected to the second display panel PN2.

The second emission control driver EM2 is connected to an emission control line of the second display panel PN2, to supply an emission control signal to the second display panel PN2. The emission control signal controls the emission time of pixels. The second gate driver SC2 is connected to a scan line of the second display panel PN2, to supply a scan signal to the second display panel PN2.

Figure 13:
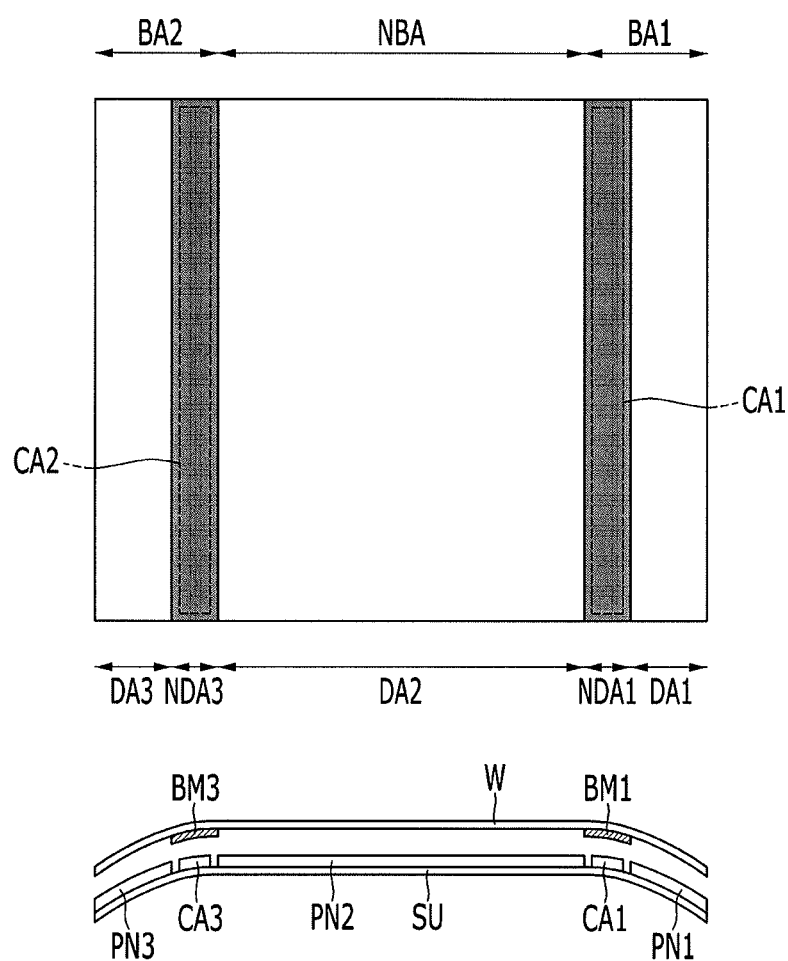
FIG. 13 illustrates another embodiment of a display device.

FIG. 13 illustrates plane and cross-sectional views of another embodiment of a display device. Referring to FIG. 13, a first bent area BA1 and a second bent area BA2 are on respective sides of the non-bent area NBA. This embodiment also includes the second bent area BA2, and the first bent area BA1 is disposed in the display device according to the embodiment of FIG. 10.

A third display panel PN3 is in the second bent area BA2. The third display panel PN3 includes a third display area DA3 and a third non-display area NDA3. The third display area DA3 represents a virtual partition for displaying an actual image on the third display panel PN3. The third non-display area NDA3 excludes the third display area DA3 and represents a virtual partition for not displaying an image.

A light blocking layer BM3 may be formed on a position corresponding to the third non-display area NDA3 on a lower portion of the window layer W. The light blocking layer BM3 prevents the third non-display area NDA3 on the lower portion from being externally exposed.

Like the first display panel PN1, the third display area DA3 of the third display panel PN3 may include one or more thin film pixel transistors, pixel electrodes, organic emission layers, and a common electrode. A third driver CA3 for driving the above-noted configuration in the third display area DA3 may be in the third non-display area NDA3.

In the present exemplary embodiment, a second driver CA2 for driving the second display panel PN2 may be in the first or third non-display area NDA1 or NDA3. In another embodiment, the first or third driver CA1 or CA3 may drive the second display panel PN2.

The third non-display area NDA3 is disposed near the non-bent area NBA. As illustrated in FIG. 13, the third non-display area NDA3 in the second bent area BA2 touches an edge of the non-bent area NBA. The first and third non-display areas NDA1 and NDA3 may face each other with respect to the non-bent area NBA.

By way of summation and review, OLED and other display devices have been developed to have curved lateral sides. Light emitted at the curved lateral sides is refracted or scattered, which adversely affects the quality of a displayed image.

In accordance with one or more of the aforementioned embodiments, the first non-display area NDA1 of the first bent area BA1 is near the non-bent area NBA. For example, an area for displaying an image does not exist in an area near the non-bent area NBA and starts being bent from the first bent area BA1. As a result, a clear image may be transmitted to the user from the first bent area BA1. The image in the non-bent area NBA may also be transmitted to the user as a clear image.

Also, the display device according to one or more of the aforementioned embodiments provides little or no dead space, since the first non-display area NDA1 is between the first and second display panels PN1 and PN2. As a result, the width of the bezel at the edge of the display device may be reduced or minimized.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the invention as set forth in the following claims.

What is claimed is:

1. A display device, comprising:
 a window layer including at least one bent area adjacent a non-bent area;
 a first display panel on a first side of the window layer and at a position corresponding to the at least one bent area;
 a second display panel on the first side of the window layer and at a position corresponding to the non-bent area; and
 a light blocking layer on a lower portion of the window layer, wherein:
 the first display panel is in a first display area to display an image,
 a first non-display area is adjacent the non-bent area and between the first display area and the non-bent area, and
 the light blocking layer is at a position corresponding to the first non-display area of the first display panel.

2. The display device as claimed in claim 1 wherein the light blocking layer includes a light blocking material.

3. The display device as claimed in claim 1, further comprising:
 a first driver to drive the first and second display panels in the first non-display area on a lower portion of the window layer, wherein the first driver includes:
 a first gate driver connected to the first and second display panels; and
 a first emission control driver connected to the first and second display panels.

4. The display device as claimed in claim 3, further comprising:
 a first data wire connected to the first display panel;
 a second data wire connected to the second display panel; and
 a control signal line connected to the first driver, wherein the control signal line is between the first and second data wires.

5. The display device as claimed in claim 1, further comprising:
 first and second drivers to respectively drive the first and second display panels, the first and second drivers in the first non-display area on a lower portion of the window layer, wherein:
 the first driver includes a first gate driver and a first emission control driver connected to the first display panel, and
 the second driver includes a second gate driver and a second emission control driver connected to the second display panel.

6. The display device as claimed in claim 1, wherein the second display panel includes:
 a second display area to display an image; and
 a second non-display area to not display an image.

7. The display device as claimed in claim 6, further comprising:
 first and second drivers at positions that respectively correspond to the first and second non-display areas, wherein:
 the first driver includes a first gate driver and a first emission control driver connected to the first display panel, and
 the second driver includes a second gate driver and a second emission control driver connected to the second display panel.

8. The display device as claimed in claim 6, further comprising:
 first and second drivers at positions that respectively correspond to the first and second non-display areas, wherein:
 the first driver includes a first gate driver connected to the first display panel, and
 the second driver includes:
 a second gate driver connected to the second display panel and
 a second emission control driver connected to the first and second display panels.

9. The display device as claimed in claim 6, further comprising:
 first and second drivers at positions that respectively correspond to the first and second non-display areas, wherein:
 the first driver includes a first gate driver connected to the first and second display panels, and
 the second driver includes a second emission control driver connected to the first and second display panel.

* * * * *